US011719773B2

(12) United States Patent
Dixit et al.

(10) Patent No.: US 11,719,773 B2
(45) Date of Patent: Aug. 8, 2023

(54) MAGNETIC FIELD SENSOR WITH MTJ ELEMENTS ARRANGED IN SERIES

(71) Applicant: GLOBALFOUNDRIES U.S. Inc., Malta, NY (US)

(72) Inventors: Hemant M. Dixit, Halfmoon, NY (US); Vinayak Bharat Naik, Singapore (SG); Kazutaka Yamane, Singapore (SG); Eng Huat Toh, Singapore (SG)

(73) Assignee: GlobalFoundries U.S. Inc., Malta, NY (US)

( * ) Notice: Subject to any disclaimer, the term of this patent is extended or adjusted under 35 U.S.C. 154(b) by 9 days.

(21) Appl. No.: 17/375,166

(22) Filed: Jul. 14, 2021

(65) Prior Publication Data

US 2023/0014455 A1 Jan. 19, 2023

(51) Int. Cl.
*G01R 33/09* (2006.01)
*G01R 33/00* (2006.01)

(52) U.S. Cl.
CPC ....... *G01R 33/098* (2013.01); *G01R 33/0005* (2013.01); *G01R 33/093* (2013.01)

(58) Field of Classification Search
CPC . G01R 33/098; G01R 33/0005; G01R 33/093
See application file for complete search history.

(56) References Cited

U.S. PATENT DOCUMENTS

| 8,421,453 | B2 | 4/2013 | Bauer | |
|---|---|---|---|---|
| 9,400,315 | B2 | 7/2016 | Hebiguchi et al. | |
| 9,460,768 | B2 | 10/2016 | Manipatruni et al. | |
| 2012/0212217 | A1* | 8/2012 | Engel | G01R 33/0023 |
| | | | | 324/252 |
| 2013/0106410 | A1* | 5/2013 | Liu | G01R 33/098 |
| | | | | 324/246 |
| 2014/0021571 | A1* | 1/2014 | Lei | H01L 43/08 |
| | | | | 257/427 |
| 2015/0325279 | A1* | 11/2015 | Roizin | G11C 11/1673 |
| | | | | 365/158 |
| 2015/0346290 | A1* | 12/2015 | Holm | G01R 33/09 |
| | | | | 324/202 |
| 2020/0333380 | A1* | 10/2020 | Vuillermet | G01R 15/202 |

FOREIGN PATENT DOCUMENTS

EP 2752675 B1 8/2020

OTHER PUBLICATIONS

Lopes, "MgO Magnetic Tunnel Junction sensors in Full Wheatstone bridge configuration for Electrical Current detection," Engenharia Fisica Tecnologica, Tecnico Lisboa, Nov. 2012.
MultiDimension Technology Co. Ltd., "Tunneling Magnetoresistance (TMR) magnetic field sensors," Mar. 12, 2015.

\* cited by examiner

*Primary Examiner* — Alvaro E Fortich
(74) *Attorney, Agent, or Firm* — Yee Tze Lim; Hoffman Warnick LLC

(57) ABSTRACT

A magnetic field sensor may include a plurality of MTJ elements. Each MTJ element of has a state indicated by a magnetic moment direction of a sensing layer relative to a pinned, reference layer in an absence of an external magnetic field. The plurality of MTJ elements are arranged into two identical sets of at least two MTJ elements, where each MTJ element in each respective set has a different state. The states of the MTJ elements are arranged in a manner to measure the external magnetic field regardless of the direction of the external magnetic field. The MTJ elements include identical layers, and are electrically serially connected.

18 Claims, 15 Drawing Sheets

MAGNETIC FIELD SENSOR WITH MTJ ELEMENTS ARRANGED IN SERIES

BACKGROUND

The present disclosure relates to magnetic field sensors, and more specifically, to a magnetic field sensor having magnetic tunnel junction (MTJ) elements arranged in series in a manner that creates a unique signal for every direction of an external magnetic field applied thereto.

Magnetic field sensors in the form of magnetoresistive transducers are used in the electronic industry to sense an external magnetic field in relation to measuring a number of parameters such as current, position, direction, and motion. One form of sensor uses tunneling magneto-resistivity (TMR). A TMR sensor uses a form of sensing element referred to as a magnetic tunnel junction (MTJ) element. MTJ elements are advantageous because they have a greater sensitivity to changes in resistivity per an applied magnetic field, especially when compared to other forms of transducers such as Hall Effect, anisotropic magnetoresistance (AMR), or giant magnetoresistance (GMR) sensors. MTJ elements may also use less power, have a smaller size, and better resolution than other forms of sensors.

An MTJ element includes a multilayer structure having, from top to bottom: a sensing layer (also known as a free ferromagnetic layer), a tunnel barrier layer, and a pinned, reference layer. The sensing layer includes a magnetic moment that is easy to move, e.g., rotate, in the presence of a relatively small external magnetic field; hence, the 'free' terminology relative to the magnetic nature of the layer. The tunnel barrier layer is an insulator such as an oxide. The pinned, reference layer may include a synthetic antiferromagnetic (SAF) pinning layer under a ferromagnetic layer. The pinned, reference layer exhibits a magnetic field having a fixed direction that does not move when exposed to an external magnetic field; hence, the 'pinned' or 'reference' terminology relative to the magnetic nature of the layer. A non-magnetic conductive electrode is coupled to each of the sensing layer and the reference layer. A parameter to be measured, such as electric current, creates an external magnetic field that causes a rotation in the magnetic moment in the sensing layer. The rotation in the magnetic moment in the sensing layer causes a change in the resistance (e.g., measured as voltage change) in the MTJ element that can be quantified to allow measurement of the parameter.

A large number MTJ elements are typically arranged in a two-dimensional Wheatstone bridge to create a TMR magnetic field sensor. A Wheatstone bridge employs a large number of MTJ elements in each arm of a balanced bridge arrangement, i.e., with the MTJ elements in an electrically parallel arrangement. In an MTJ element, a response curve of resistance (R) versus magnetic field (H) (i.e., R vs. H) is not linear. A maximum response (resistance change) in an MTJ element is sensed when the external magnetic field is perpendicular to the magnetic moment in the sensing layer. However, no response is sensed when the external magnetic field is parallel to the magnetic moment in the sensing layer. Accordingly, in order to achieve good sensitivity, different types of MTJ elements with opposite response curves R vs. H are used in the Wheatstone bridge, e.g., ones with increased resistance with increasing magnetic field, and others with decreased resistance with increasing magnetic field. A challenge with this arrangement is that when the direction of the external magnetic field is not known, the measurement can be incorrect and/or ambiguous. In order to address this situation, current Wheatstone bridges use arms with hundreds of MTJ elements arranged in an X and Y orientation to attempt to accurately measure the external magnetic field by adding the two components. The areal size of the magnetic field sensor can thus be very large. Another challenge is that external magnetic fields that are non-orthogonal to the sensing layers in the sensor, e.g., at 45°, create ambiguous results. For example, using current Wheatstone bridge approaches, there is no difference in measured resistance for a magnetic field at +45° from the direction of the magnetic field in the sensing layer, and a magnetic field that is at is −45° from the direction of the magnetic field in the sensing layer. Accordingly, positioning of the sensor is critically important to ensure proper sensing.

Another complexity with current Wheatstone bridge approaches is that the two types of MTJ elements with different response curves use different numbers of layers, and different materials in the layers. For example, the MTJ element with one response curve may use a reference layer having four layers, while the MTJ element with the opposite response curve may use a reference layer using six layers. The formation of the magnetic field sensor can thus be very complex and expensive.

SUMMARY

An aspect of the disclosure is directed to a magnetic field sensor, comprising: a first plurality of magnetic tunnel junction (MTJ) elements, each MTJ element of the first plurality of MTJ elements having a state indicated by a magnetic moment direction of a sensing layer relative to a pinned, reference layer in an absence of an external magnetic field, the first plurality of MTJ elements arranged into two identical sets of at least two MTJ elements, each MTJ element in each respective set having a different state, the two identical sets and the at least two MTJ elements in each set being electrically serially connected.

Another aspect of the disclosure includes a magnetic field sensor, comprising: a first plurality of magnetic tunnel junction (MTJ) elements, each MTJ element of the first plurality of MTJ elements having a state indicated by a magnetic moment direction of a sensing layer relative to a pinned, reference layer in an absence of an external magnetic field, the first plurality of MTJ elements arranged into two identical sets of at least two MTJ elements, each MTJ element in each respective set having a different state, the two identical sets and the at least two MTJ elements in each set being electrically serially connected, wherein the first plurality of MTJ elements includes at least: a first MTJ element having the state thereof in a first direction, and a second MTJ element having the state thereof in a second direction approximately perpendicular to the first direction, and wherein the first plurality of MTJ elements generate a unique signal for every direction of an external magnetic field applied thereto.

An aspect of the disclosure related to a magnetic field sensor, comprising: a plurality of magnetic tunnel junction (MTJ) elements arranged in two dimensions, each MTJ element of the plurality of MTJ elements having a state indicated by a magnetic moment direction of a sensing layer relative to a pinned, reference layer in an absence of an external magnetic field, the plurality of MTJ elements arranged into two identical sets of at least two MTJ elements, each MTJ element in each respective set having a different state, the two identical sets and the at least two MTJ elements in each set being electrically serially connected; and a magnetic field diverter positioned to direct an external magnetic field having a direction outside of the two dimensions into the two dimensions for sensing by the first plurality of MTJ elements.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
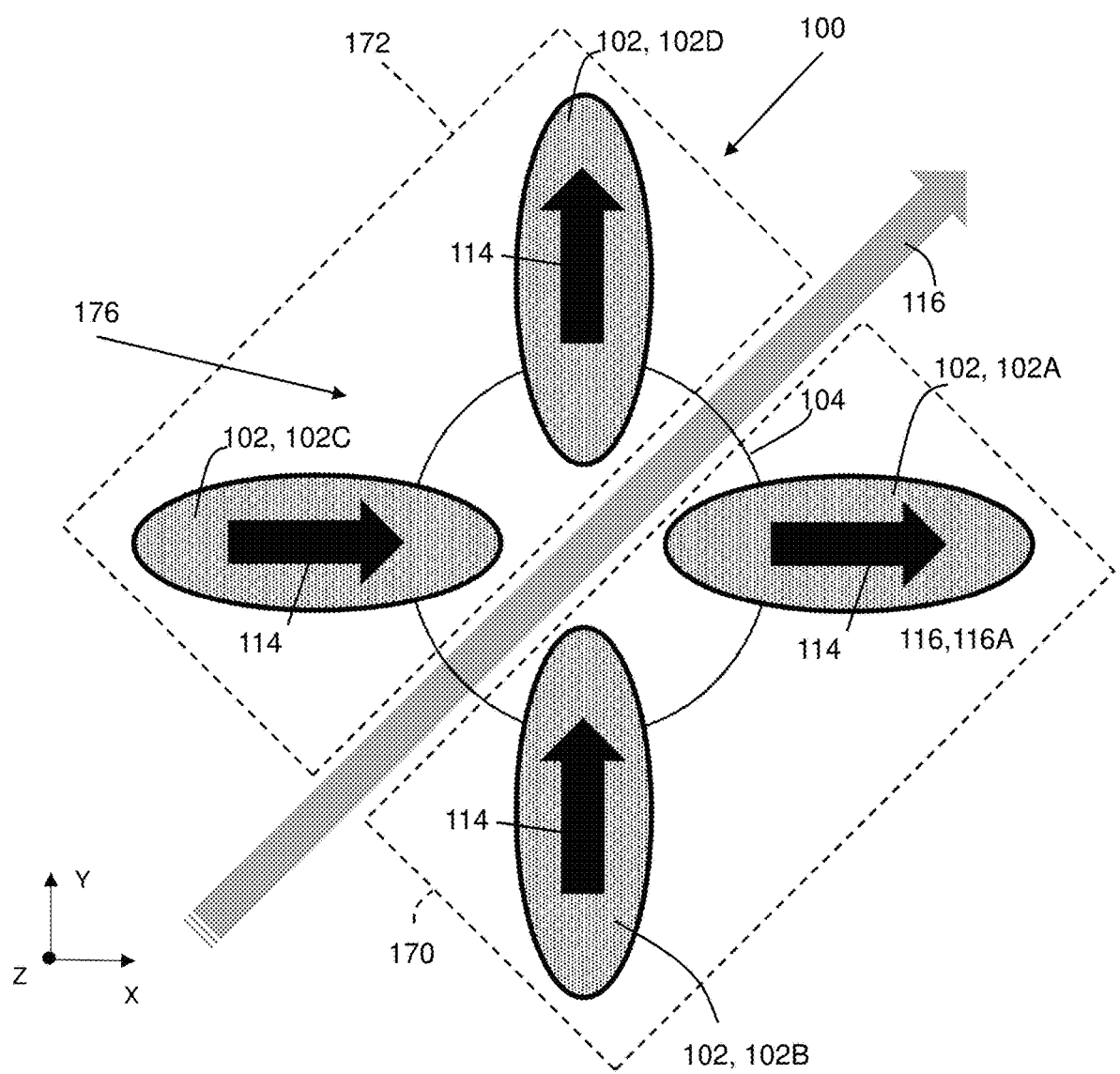
FIG. 1 shows a schematic plan view of a magnetic field sensor, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a magnetic field sensor. The magnetic field sensor can be used to measure a variety of parameters that create an external magnetic field, e.g., current, position, direction, motion, etc. The magnetic field sensor is in the form of a magnetoresistive transducer that employs tunneling magneto-resistivity (TMR) technology, and more particularly, magnetic tunnel junction (MTJ) elements. As noted, TMR and MTJ elements are advantageous because they have, for example, a greater sensitivity to changes in resistivity per an applied magnetic field, especially when compared to other forms of transducers such as Hall Effect, anisotropic magnetoresistance (AMR), or giant magnetoresistance (GMR) sensors. The magnetic field sensor may include a plurality of MTJ elements. As will be described, each MTJ element has a 'state' indicated by a magnetic moment direction of a sensing layer relative to a pinned, reference layer in an absence of an external magnetic field.

The plurality of MTJ elements are arranged into two identical sets of at least two MTJ elements, where each MTJ element in each respective set has a different state. That is, each MTJ element in each set has a different direction of the magnetic field in its sensing layer. The states of the MTJ elements are arranged in a manner to measure the external magnetic field regardless of the direction of the external magnetic field. More specifically, regardless of the direction of the external magnetic field applied to the sensor, it creates a unique signal (e.g., a unique change in resistance as measured by voltage), removing any ambiguity as to the direction of the external magnetic field. The magnetic field sensor can be arranged as a two-dimensional sensor or a three-dimensional sensor. The two identical sets with two or more MTJ elements in each set are electrically serially connected. Hence, the magnetic field sensor eliminates the challenges of a Wheatstone bridge arrangement. The magnetic field sensor also has a unique response curve (R vs. H) that exhibits less noise and variability. The sensor can also be manufactured with much less complexity and expense, compared to conventional sensors. More specifically, the sensor can be built using thin film technology using MTJ elements that are all identical, thus eliminating the manufacturing challenges of forming two types of MTJ elements with, for example, different numbers of layers and different materials. The sensor also employs a significantly lower number of MTJ elements; for example, as few as four compared to hundreds.

Referring to FIG. 1, a schematic plan view of a magnetic field sensor 100 according to embodiments of the disclosure is illustrated. Magnetic field sensor 100 (hereinafter "sensor 100" for brevity) may include a (first) plurality of magnetic tunnel junction (MTJ) elements 102 electrically connected in series. The electrical connection is indicated by the circular line 104. The plurality of MTJ elements 102 includes at least four MTJ elements 102A-D.

Figure 2A:
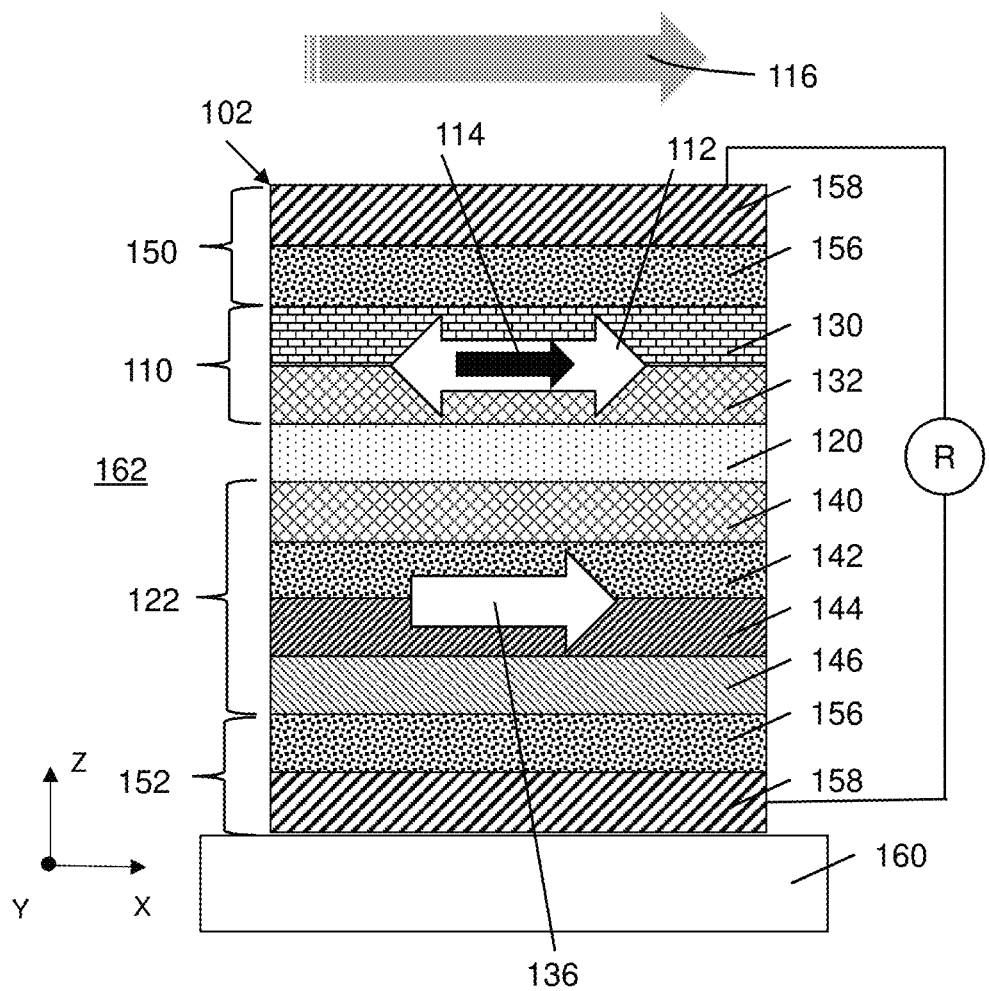
FIG. 2A shows a cross-sectional view of an illustrative magneto resistive junction (MTJ) element.
Figure 2B:
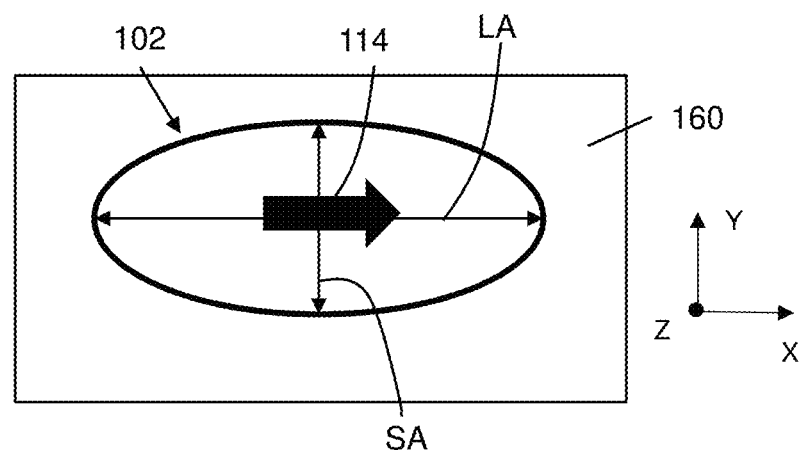
FIG. 2B shows a schematic plan view an illustrative MTJ element.

FIG. 2A shows a cross-sectional view of one illustrative MTJ element 102 that may be used in a sensor 100 according to embodiments of the disclosure. Each MTJ element 102 has a "state" 114 indicated by a magnetic moment direction of a free, sensing layer 110 (hereafter "sensing layer 110") relative to a pinned, reference layer 122 in an absence of an external magnetic field 116. In order to ensure that the resistance changes linearly when the magnetic moment of sensing layer 110 is rotated by external magnetic field 116, the relative orientation of the magnetic moment between reference layer 122 and sensing layer 110 is set to be perpendicular to each other. Hence, "state" 114 for each MTJ element 102 is the direction of magnetic moment 112 in sensing layer 110 in the absence of external magnetic field 116. A state 114 of an MTJ element 102 is indicated by black arrows throughout the drawings, and external magnetic field(s) 116 are indicated throughout the drawings with gray arrows. Magnetic moment 112 is shown only in FIG. 2A with double arrows to indicate it is readily movable/rotatable. As shown in FIG. 2B, sensing layer 110 and reference layer 122 of MTJ elements 102 have a long axis (LA) and a short axis (SA). In the example of FIG. 2B, layers 110, 122 are aligned atop one another. The direction of magnetic moment 112 of sensing layer 110 and hence state 114 thereof extends along long axis LA, which is the natural state in absence of external magnetic field 116. In this manner, state 114 of each MTJ element 102 can be set in a desired direction based on how the MTJ element 102, i.e., layers 110, 112, is arranged during manufacture.

As shown in FIG. 2A, MTJ elements 102 each include at least a pinned or fixed reference layer 122, a tunnel barrier layer 120 and sensing layer 110. Hence, each MTJ element 102 includes a multilayer structure. Sensing layer 110 may include one or more ferromagnetic layers 130, 132 (two shown) that generate a magnetic field 112 that is relatively easy to move, e.g., rotate, in the presence of a relatively small external magnetic field 116. In one non-limiting example, sensing layer 110 may include ferromagnetic metal(s) and/or compound(s) such as nickel-iron (NiFe) layer 130 and a cobalt-iron-boron-tantalum layer (CoFeBTa) 132. NiFe layer 130 is a ferromagnetic alloy, which is known as a Mu-metal. Tunnel barrier layer 120 includes one or more insulator layers (one shown) including, for example, an oxide such as but not limited to: magnesium oxide (MgO), silicon oxide ($SiO_2$), or aluminum oxide ($Al_2O_3$). Pinned or fixed reference layer 122 (hereafter "reference layer 122") exhibits a magnetic moment 136 having a fixed or pinned direction. In FIG. 2A, magnetic moment 136 extends within a plane of reference layer 122. Reference layer 122, which also may be referred to as a pinned antiferromagnetic layer, may include, for example, a synthetic antiferromagnetic (SAF) pinning layer. The SAF pinning layer may include, for example: a CoFeBTa layer 140, a ruthenium layer 142, a cobalt iron (CoFe) layer 144, and a platinum manganese (PtMn) layer 146. Reference layer 122 thus may include a ferromagnetic layer, e.g., CoFeBTa layer 140, over a more voluminous antiferromagnetic layer(s) 142, 144, 146, the latter of which acts to fix ('pin') a direction of magnetic moment 136. A non-magnetic conductive electrode 150 may couple to sensing layer 110, and a non-magnetic conductive electrode 152 may couple to pinning layer 120. Each conductive electrode 150, 152 may include any now known or later developed non-magnetic electrode, for example, a ruthenium layer 156 and a tantalum layer 158.

Figure 3A:
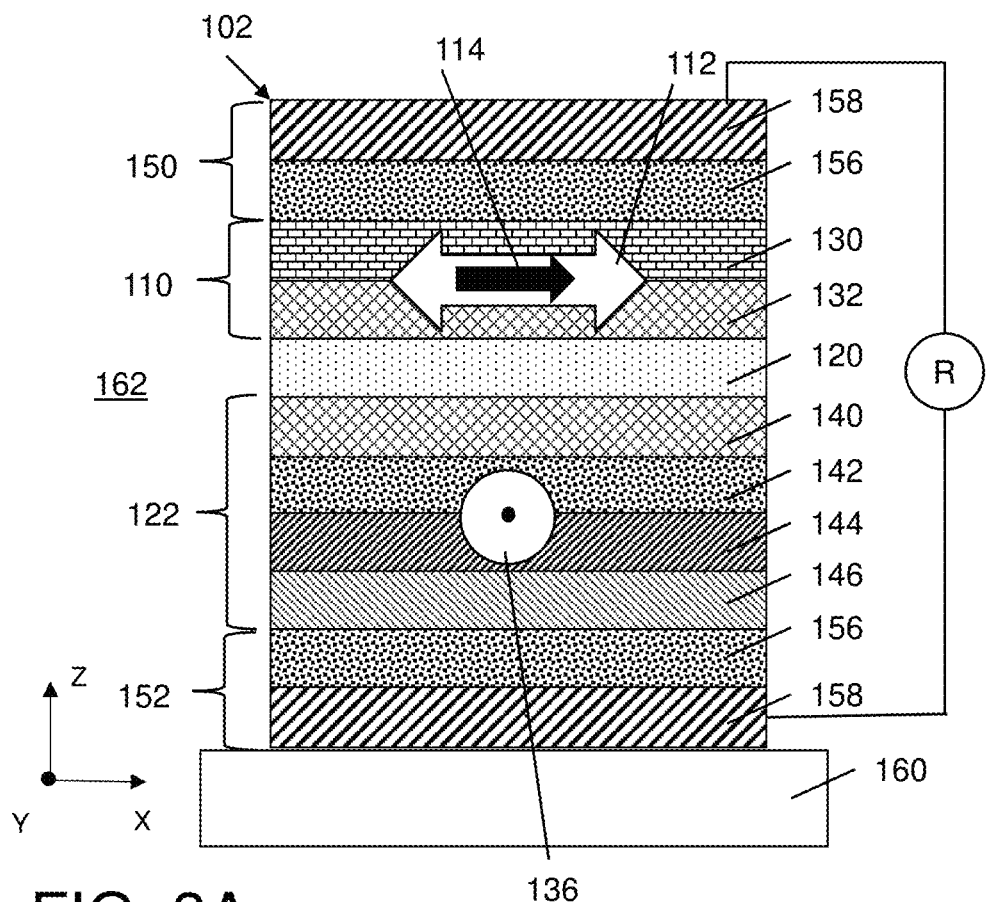
FIG. 3A shows a cross-sectional view of another illustrative MTJ element.
Figure 3B:
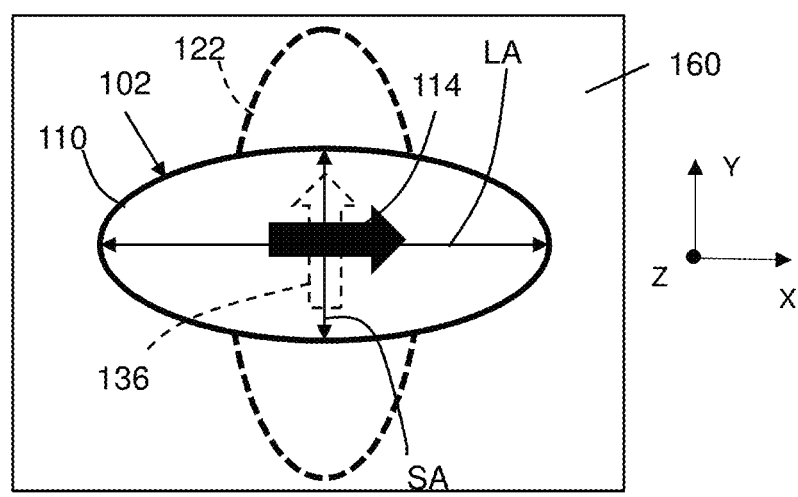
FIG. 3B shows a schematic plan view another illustrative MTJ element.
Figure 3C:
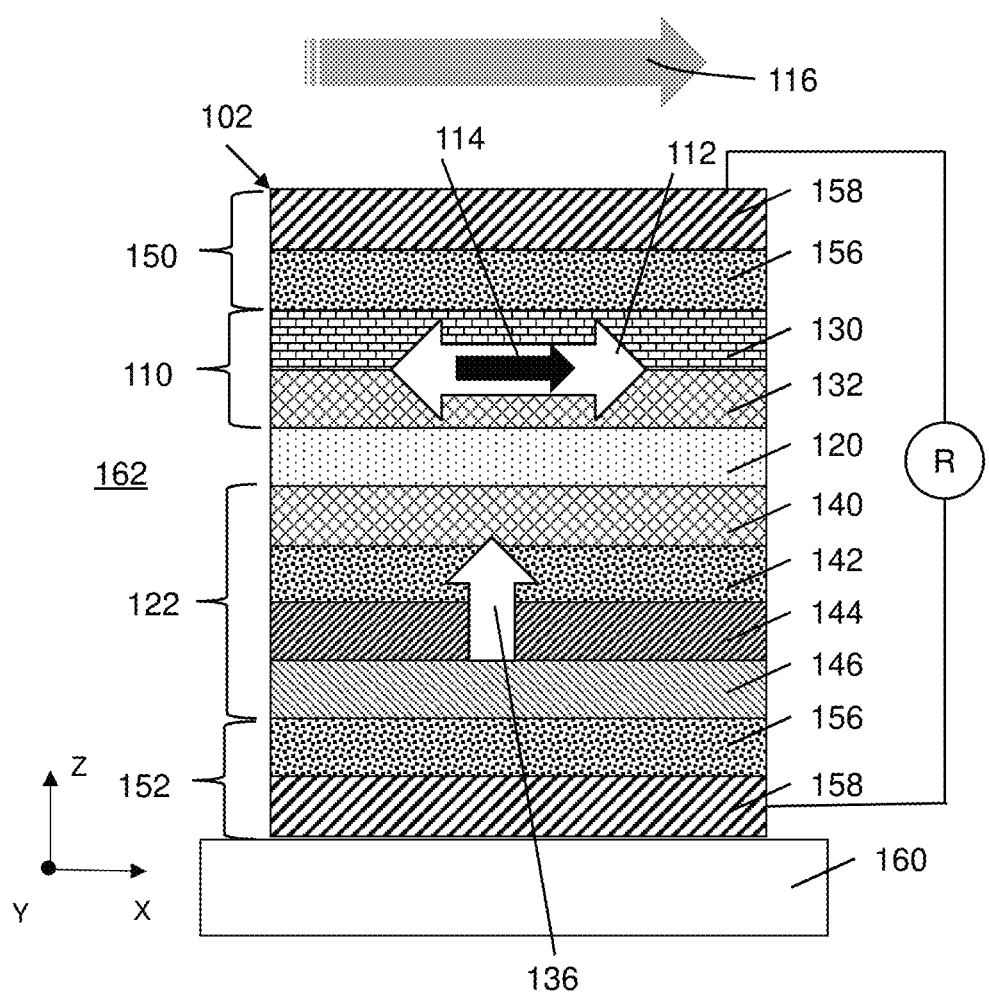
FIG. 3C shows a cross-sectional view of yet another illustrative MTJ element.

FIGS. 3A-C show variations of MTJ elements 102 that may also be employed according to embodiments of the disclosure. FIG. 3A shows a cross-sectional view and FIG. 3B shows a schematic plan view of another illustrative MTJ element 102 that may be used in a sensor 100. MTJ element 102 of FIGS. 3A-B is substantially similar to that of FIGS. 2A-B, except as shown best in FIG. 3B, the long axis of reference layer 122 is turned perpendicular to that of sensing layer 110. Hence, magnetic moment 112 of sensing layer 110 is perpendicular to magnetic moment 136 of reference layer 122. FIG. 3A shows magnetic moment 136 (arrow tip or tail) extending into or out of the page. FIG. 3C shows a cross-sectional view of yet another illustrative MTJ element 102 that may be used in a sensor 100. MTJ element 102 of FIG. 3C is similar to that of FIGS. 2A-B and 3A-B, except magnetic moment 136 of reference layer 122 extends vertically (shown upward, but could be downward), which may be easier to manufacture.

MTJ elements 102 may be formed over any now known or later developed semiconductor substrate 160 as part of thin film technology processing. MTJ elements 102 may be embedded in any now known or later developed dielectric material 162 (FIG. 2A). It is emphasized that while example layers of an MTJ element 102 have been described herein, the disclosure is not limited to any particular type of MTJ element 102, and that a large variety of alternatives are known and applicable to embodiments of the present disclosure. However, in accordance with embodiments of the disclosure, MTJ elements 102 used in sensor 100 may be identical and include identical layers. Accordingly, sensor 100 eliminates the manufacturing challenges present with forming a sensor using different types of MTJ elements with, for example, different numbers of layers and different materials.

With regard to individual MTJ elements 102, in operation, a parameter to be measured, such as electrical current, creates an external magnetic field 116 that causes magnetic field 112 to rotate in sensing layer 110, changing its state 114. The rotation in magnetic field 112 in sensing layer 112 causes a change in the resistance (R) (e.g., measured as voltage change) in the respective MTJ element 102 that can be quantified to allow measurement of the parameter in a known manner. As the manner of quantifying the measurement is well known, no further detail is warranted.

Returning to FIG. 1, plurality of MTJ elements 102A-D may be arranged into two identical sets 170, 172 (marked with dashed boxes) of at least two MTJ elements, e.g., 102A-B and 102C-D, respectively. Each MTJ element 102A and 102B, or 102C and 102D, in each respective set 170, 172 have a different state 114. That is, MTJ element 102A have a different state 114 (left-to-right on page) than MTJ element 102B (down-to-up on page) in set 170. In the same manner, MTJ element 102C has a different state 114 (left-to-right on page) than MTJ element 102D (down-to-up on page). The sets 170, 172 are identical in that states 114 of serially connected MTJ elements 102A-B and 102C-D repeat. As noted, the two identical sets 170, 172 and the two or more MTJ elements 102A-B, 102C-D in each set 170, 172 are electrically serially connected, i.e., via connector line 104 shown schematically in FIG. 1.

Each of MTJ elements 102 in sensor 104 include identical layers. (See, for example, layers in illustrative MTJ element 102 in FIG. 2A). That is, they all have the same number of layers with the same materials, so they can be formed simultaneously. The use of MTJ elements 102 with identical layers makes manufacture simpler than sensors that use two different types of MTJ elements.

The number of MTJ elements 102 in each set 170, 172 can vary. In one embodiment, the number can be any even number of MTJ elements 102 desired to ensure accurate measurement of external electric field 116 (one example in FIG. 1). In FIG. 1, each set 170, 172 includes two MTJ elements, creating a sensor with four MTJ elements 102. More specifically, each set 170, 172 includes a first MTJ element 102A, 102C having state 114 thereof in a first direction. In the example shown, the first direction is left-to-right on the page, but it can be any direction. As will be described, the first direction acts as a reference direction for describing the states of the other MTJ elements 102. In FIG. 1, each set 170, 172 also includes a second MTJ element 102B, 102D having state 114 thereof in a second direction (e.g., down-to-up on page) approximately perpendicular to the first, reference direction. As used herein with reference to the directions of states 114, "approximately" indicates +/−2°.

Figure 14:
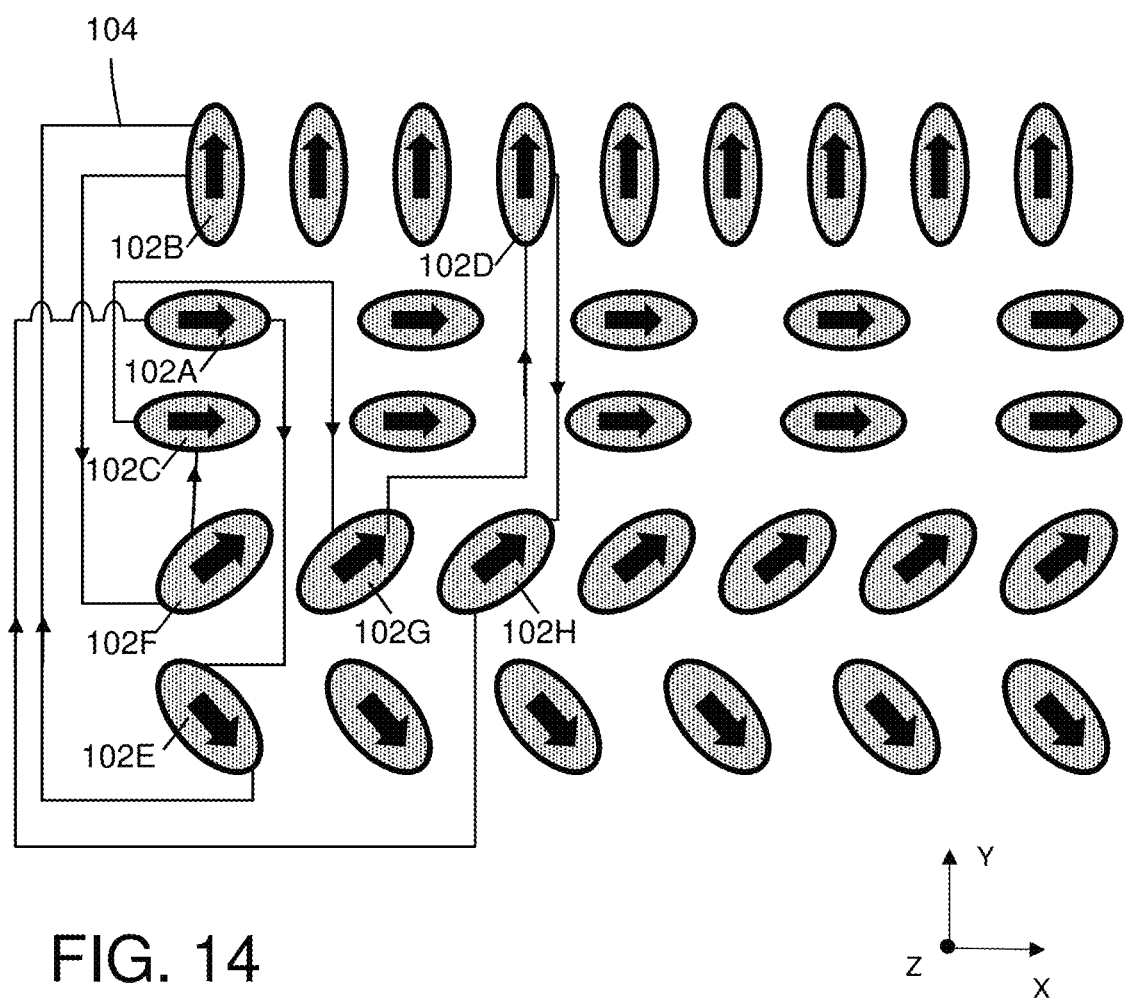
FIG. 14 shows a schematic plan view of an illustrative array of MTJ elements coupled to form a magnetic field sensor, according to embodiments of the disclosure.

As illustrated, plurality of MTJ elements 102A-D function collectively in a floral pattern 176, i.e., as if centered about a center point CP and extending radially therefrom. In this regard, it will be recognized that MTJ elements 102 may be physically laid out in any fashion using thin film technology. For example, as shown in the example in FIG. 14, MTJ elements 102 may be built in rows, columns or arrays of MTJ elements 102 having the same state 114, but be electrically serially connected by line 104 to collectively act as if in floral pattern 176.

Figure 4:
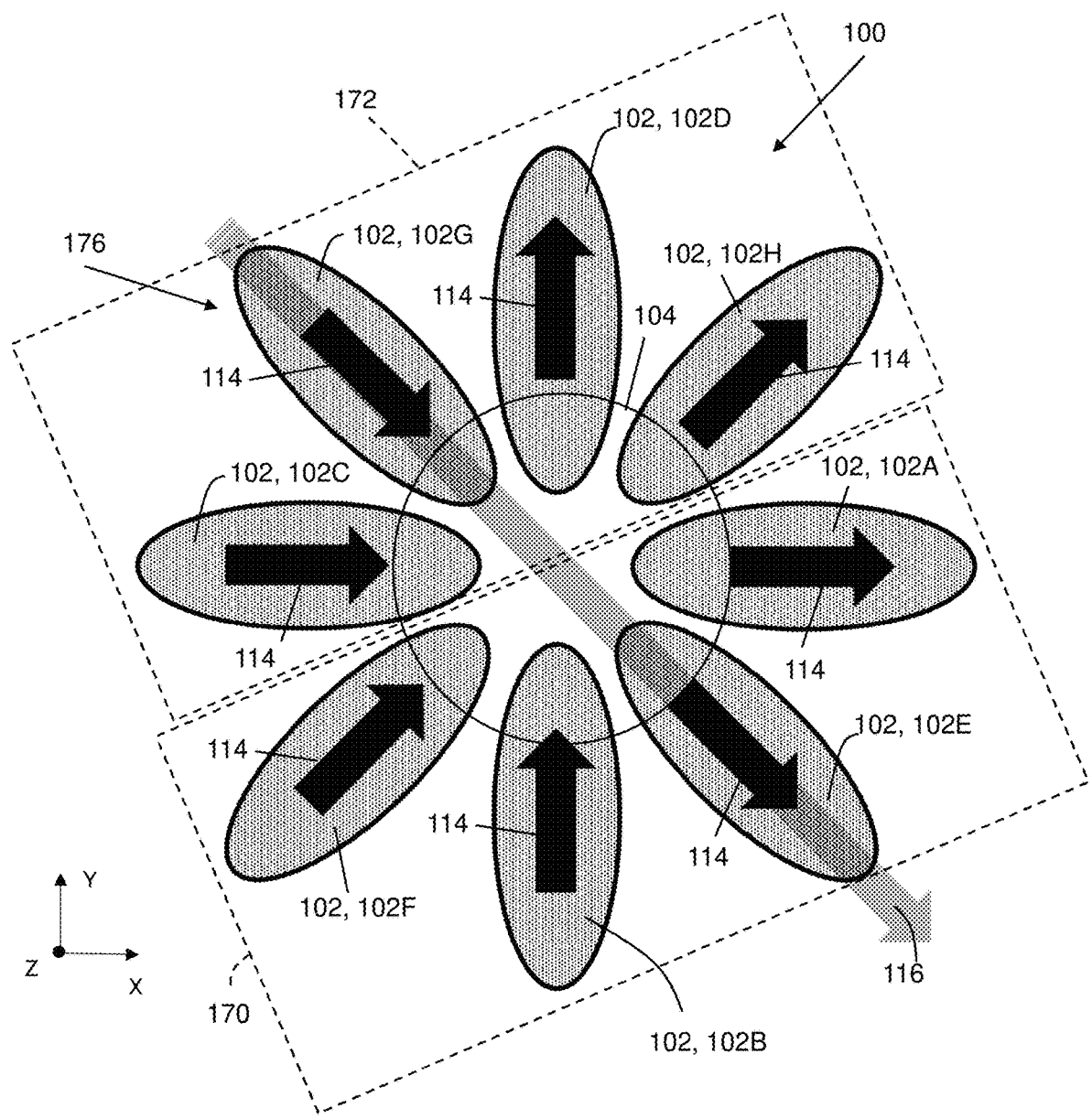
FIG. 4 shows a schematic plan view of a magnetic field sensor, according to other embodiments of the disclosure.

Referring to FIG. 4, a schematic view of another embodiment of sensor 100 is illustrated. In this embodiment, sensor 100 includes MTJ elements 102A-D as in FIG. 1, but each set 170, 172 further includes a third and fourth MTJ element 102, creating an eight element petal floral pattern 176 rather than a four element petal pattern as in FIG. 1. In this manner, sensor 100 of FIG. 4 can sense a larger variety of external magnetic fields 116 (only one shown in FIG. 4), e.g., across a larger variety of external magnetic field directions. Set 170 includes a third MTJ element 102E positioned serially between MTJ element 102A and MTJ element 102B, and a fourth MTJ element 102F serially downstream from MTJ element 102B. Similarly, set 172 includes a third MTJ element 102G positioned serially between MTJ element 102C and MTJ element 102D, and a fourth MTJ element 102H serially downstream from MTJ element 102D. The angles of MTJ elements 102E-H relative to the reference direction (i.e., first, reference direction of MTJ elements 102A, 102C) can be selected to ensure pairs of MTJ elements 102 are perpendicular to an anticipated external magnetic field 116. For example, third MTJ element 102E may have a state 114 thereof in a third direction of between 10° and 80° relative to the first, reference direction (left-to-right in example shown). In the non-limiting example shown, third MTJ element 102E of set 170 has a state 114 in a third direction at approximately a 45° angle relative to first, reference direction of MTJ element 102A. Similarly, third MTJ element 102G of set 172 has a state 114 in a third direction of between 10° and 80° relative to first, reference direction of MTJ element 102C. In the non-limiting example shown, third MTJ element 102G of set 172 has a state 114 in a third direction at approximately a 45° angle relative to first, reference direction of MTJ element 102C.

A similar arrangement is provided for fourth MTJ elements 102F and 102H of each set 170, 172, respectively. For example, fourth MTJ element 102F may have a state 114 thereof in a fourth direction of between 110° and 170° relative to the first, reference direction (left-to-right in example shown). In the non-limiting example shown, fourth MTJ element 102F of set 170 has a state 114 in a third direction at approximately a 135° angle relative to first, reference direction of MTJ element 102A. Similarly, fourth MTJ element 102H of set 172 has a state 114 in a fourth direction of between 110° and 170° relative to first, reference direction of MTJ element 102C. In the non-limiting example shown, fourth MTJ element 102H of set 172 has a state 114 in a fourth direction at approximately a 135° angle relative to first, reference direction of MTJ element 102C.

The angles of states 114 of all of MTJ elements 102A-H in a given sensor 100 relative to the reference direction (i.e., first, reference direction of MTJ elements 102A, 102C) can be selected to ensure pairs of MTJ elements 102 are perpendicular to an anticipated external magnetic field 116 to ensure a maximum response from at least one pair of MTJ elements 102. As will be further described, the use of a number MTJ elements 102 at non-orthogonal state angles relative to external magnetic field 116 also contributes to the response to allow identification of a direction of external magnetic field 116.

As illustrated, plurality of MTJ elements 102A-H function collectively in a floral pattern 178, i.e., as if centered about a center point CP and extending radially therefrom. As noted previously, MTJ elements 102A-H may be physically laid out in any fashion using thin film technology. For example, MTJ elements 102A-H may be built in rows, columns or arrays of MTJ elements 102 having the same state 114, but be electrically serially connected by line 104 to collectively act as if in a floral pattern 178.

FIGS. 5-8 show alternative embodiments of magnetic field sensor 100, according to embodiments of the disclosure.

Figure 5:
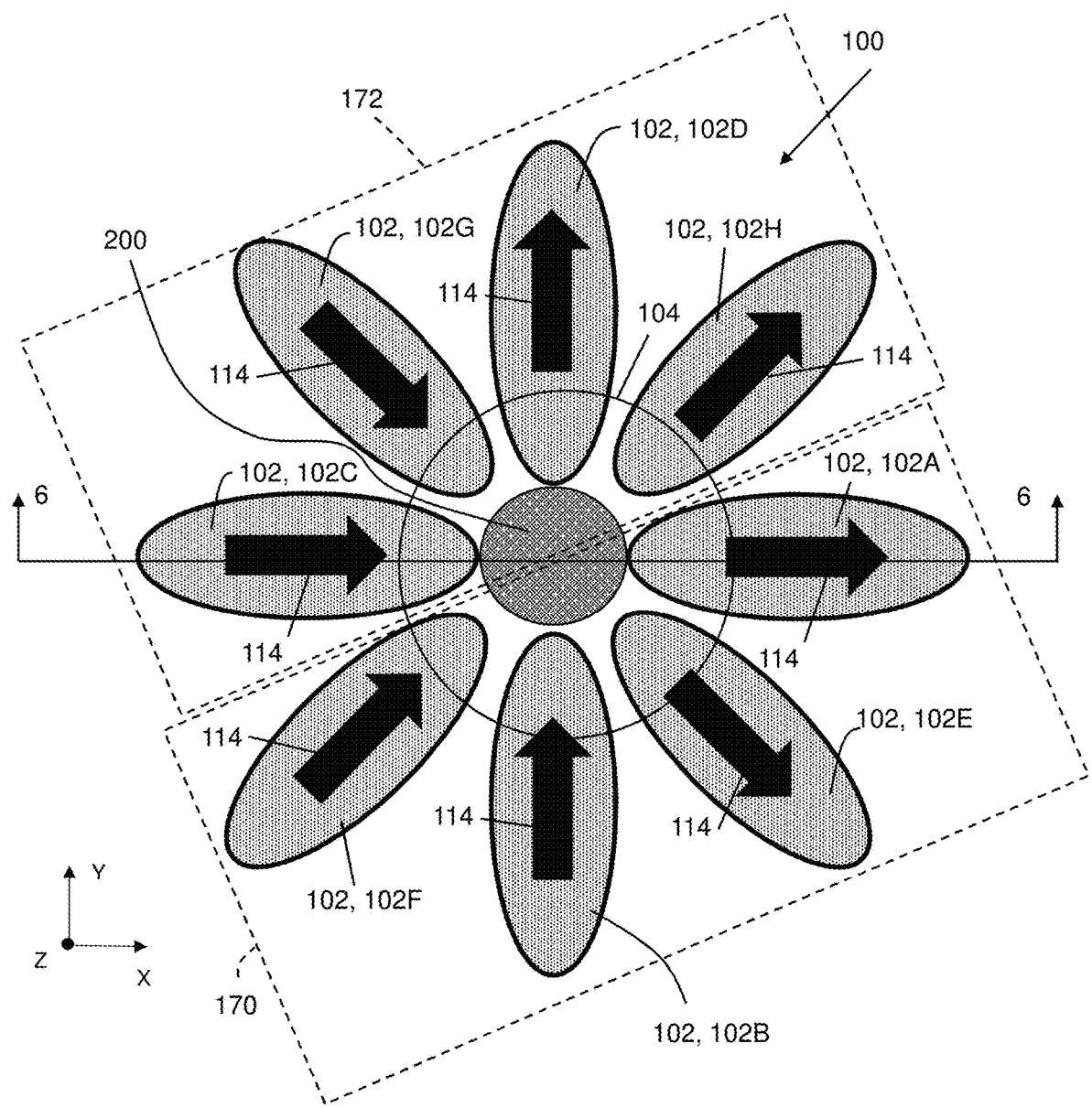
FIG. 5 shows a schematic plan view of a magnetic field sensor, according to further embodiments of the disclosure.
Figure 6:
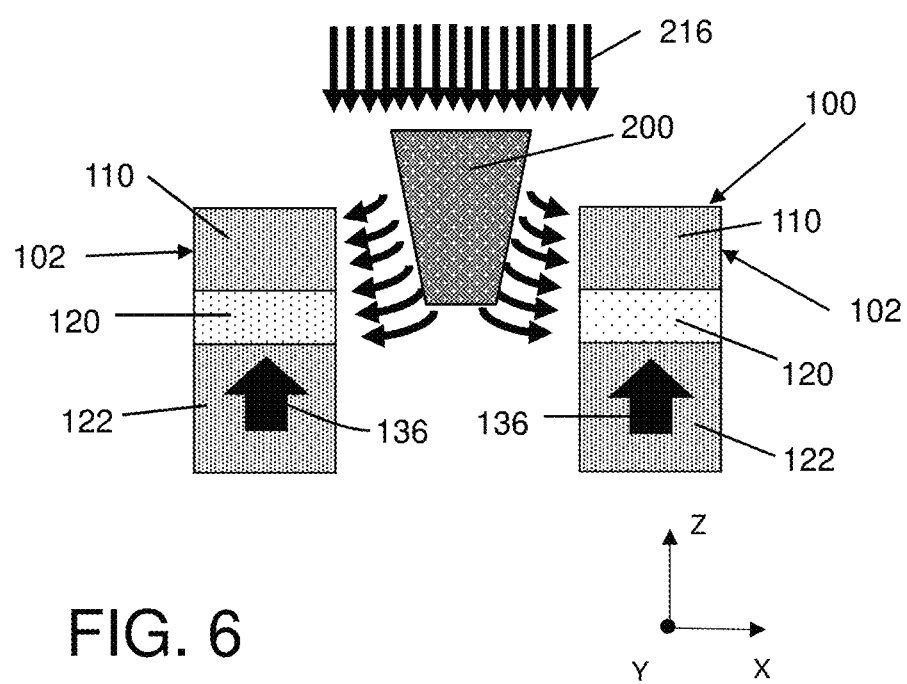
FIG. 6 shows a cross-sectional view of the magnetic field sensor of FIG. 5 along view line 6-6.

In the previously described embodiments, MTJ elements 102 of sensor 100 are arranged in two dimensions, e.g., in a plane of an integrated circuit. FIG. 5 shows a schematic plan view and FIG. 6 shows a cross-sectional view along view line 6-6 in FIG. 5 of a sensor 100 in which MTJ elements 102 are also arranged in two dimensions. In these embodiments, however, sensor 100 also includes a magnetic field diverter 200 positioned to direct an external magnetic field 216 (FIG. 6 only) having a direction outside of the two dimensions of MTJ elements 102 into the two dimensions for sensing by plurality of MTJ elements 102. Magnetic field diverter 200 thus converts a Z component of an external magnetic field 216 (FIG. 6) into an X-Y field that can be measured by sensor 100. Magnetic field diverter 200 may include any now known or later developed paramagnetic material such as a Mu-metal. In one non-limiting example, magnetic field diverter 200 may divert as much as 70% of the Z of external magnetic field 216. It is noted that sensor 100 cannot differentiate the Z component of external magnetic field 216 from the regular X or Y components of the external magnetic field 116 (one example shown in FIG. 5). Magnetic field diverter 200 may have any shape desired to divert external magnetic field 216 (FIG. 6) into MTJ elements 102. In the example shown, magnetic field diverter 200 has a frusto-conical shape; however, other shapes may be possible. In the FIGS. 5-6 illustrations, sensor 100 includes MTJ elements 102 arranged as in FIG. 4. It will be recognized that the teachings of FIGS. 5-6 are usable with sensor(s) according to any embodiment described herein.

Figure 7:
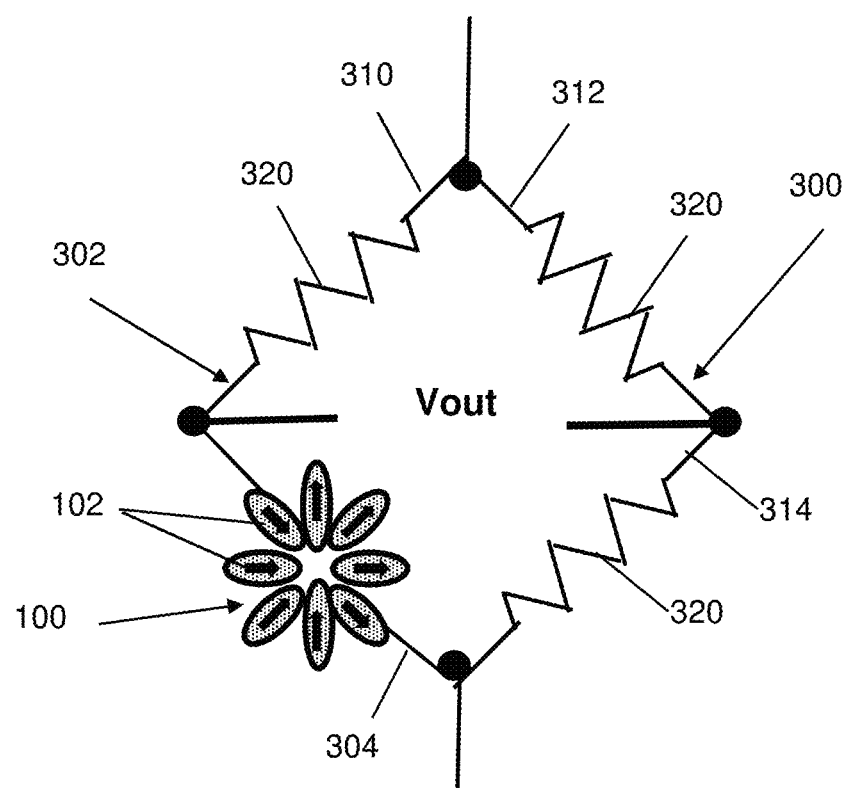
FIG. 7 shows a schematic plan view of a magnetic field sensor using a Wheatstone bridge arrangement, according to embodiments of the disclosure.
Figure 8:
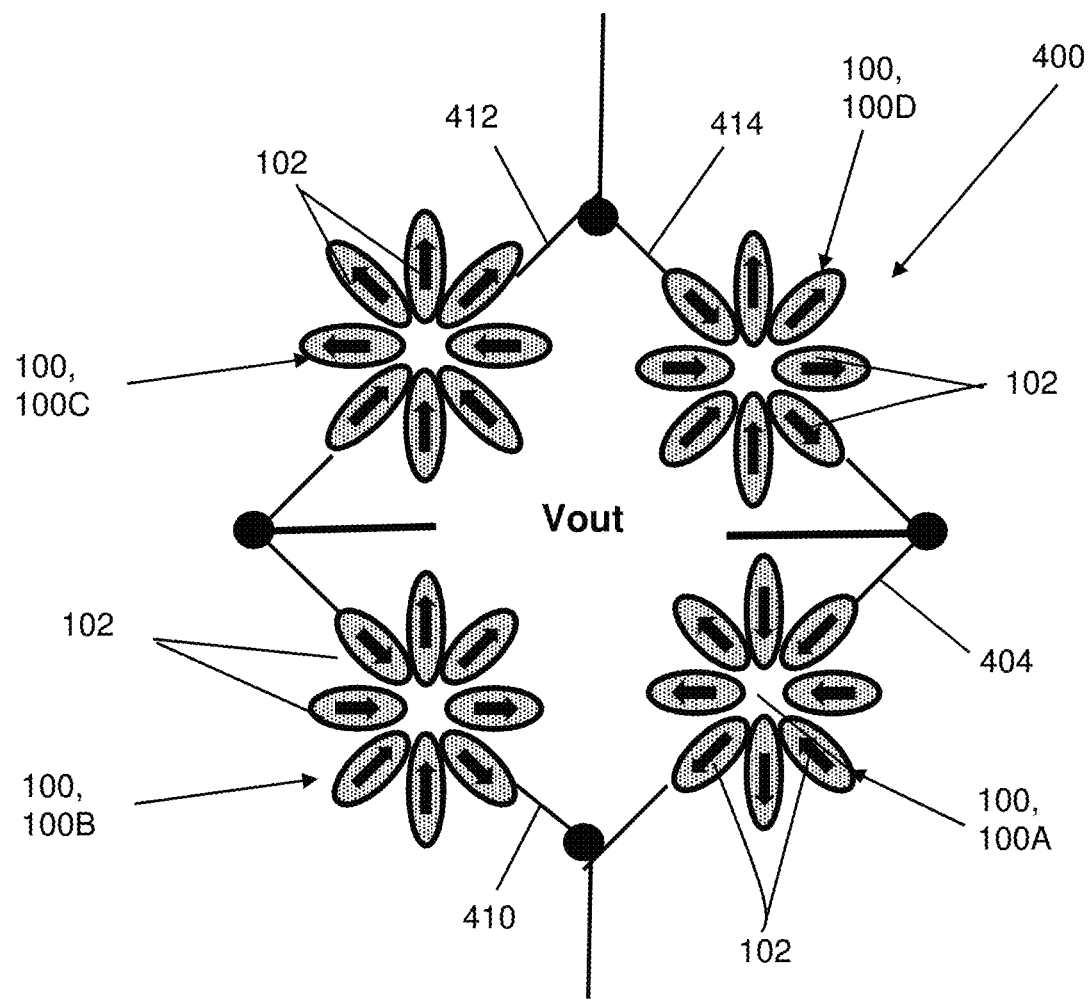
FIG. 8 shows a schematic plan view of a magnetic field sensor using a Wheatstone bridge arrangement, according to another embodiment of the disclosure.

FIGS. 7 and 8 show schematic views of embodiments in which magnetic field sensor(s) 100 as described herein, each with a plurality of MTJ elements 102, is/are positioned in a Wheatstone bridge magnetic field sensor 300 or 400. FIG. 7 shows a Wheatstone bridge magnetic field sensor 300 (hereafter "sensor 300") with plurality of MTJ elements 102 of sensor 100 in a first quarter arm 304 of a Wheatstone bridge 302. Here, Wheatstone bridge 302 includes a second quarter arm 310, a third quarter arm 312 and a fourth quarter arm 314 that each include a resistor 320 of a fixed value. Sensor 300 may be referred to as a quarter bridge circuit. MTJ elements 102 in sensor 100 in first quarter arm 304 are electrically connected in series, while the arms 304, 310, 312, 314 of the bridge are electrically connected in parallel in a known fashion. Sensor 300 provides the advantages of the MTJ elements 102 described herein, but with resistors 320 reducing the number of MTJ elements required compared to conventional Wheatstone bridge arrangements. Resistors 320 can include any now known or later developed thin film technology resistors such as but not including metal resistors, polysilicon resistors, etc.

FIG. 8 shows a Wheatstone bridge magnetic field sensor 400 (hereafter "sensor 400") with a first plurality of MTJ elements 102 (i.e., sensor 100A) in a first quarter arm 404 of a Wheatstone bridge 402. Wheatstone bridge 402 of sensor 400 also includes a second quarter arm 410 including a second plurality of MTJ elements 102 (i.e., sensor 100B), a third quarter arm 412 including a third plurality of MTJ elements 102 (i.e., sensor 100C), and a fourth quarter arm 414 including a fourth plurality of MTJ elements 102 (i.e., sensor 100D). Hence, a sensor 100 as described herein is positioned in each arm of Wheatstone bridge 402 of sensor 400. Sensor 400 provides the advantages of the MTJ elements 102 as in sensor 100 and with greater sensitivity to vary directions of external electric fields 116, but with reduced numbers of MTJ elements compared to conventional Wheatstone bridge arrangements. Each plurality of MTJ elements 102 can be arranged as described in any embodiment herein. In sensor 400, MTJ elements 102 in each of the first plurality of MTJ elements, the second plurality of MTJ elements, the third plurality of MTJ elements and the fourth plurality of MTJ elements are electrically connected in series, while the arms 404, 410, 412, 414 of the bridge are electrically connected in parallel in a known fashion. As illustrated, first plurality of MTJ elements 102 (sensor 100A) and the third plurality of MTJ elements 102 (sensor 100C) are in opposing quarter arms 404, 412 of the Wheatstone bridge 402 and have identical arrangements, e.g., with their first, reference directions in the same direction. In addition, the second plurality of MTJ elements 102 (sensor 100B) and the fourth plurality of MTJ elements 102 (sensor 100D) are in opposing quarter arms 410, 414 of Wheatstone bridge 402 and have identical arrangements, e.g., with their first, reference directions in the same direction. However, as can be observed by comparing the directions of states 114 in each sensor 100A-D in FIG. 8, second plurality of MTJ elements 102 (sensor 100B) and fourth plurality of MTJ elements 102 (sensor 100D) have different arrangements than first plurality of MTJ elements 102 (sensor 100A) and third plurality of MTJ elements 102 (sensor 100C), e.g., they have different reference directions. In the FIGS. 7-8 illustrations, sensors 100 include MTJ elements 102 arranged as in FIG. 4. It will be recognized that the teachings of FIGS. 7-8 are usable with sensor(s) 100 according to any embodiment described herein.

Figure 9:
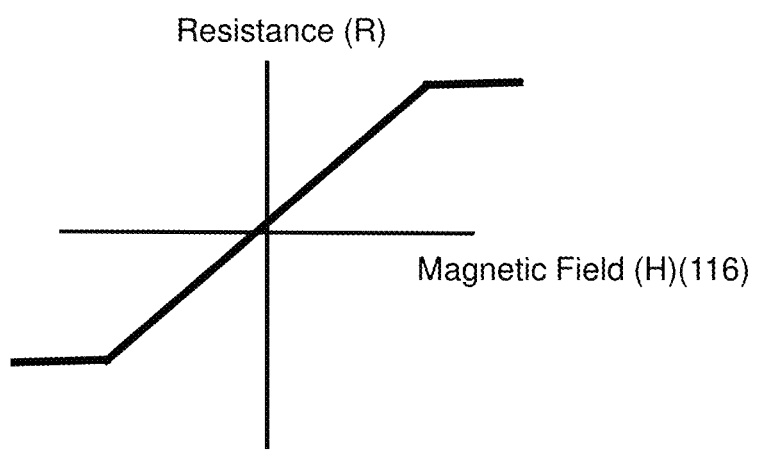
FIG. 9 shows a graph illustrating a response curve (R vs. H) of a magnetic field sensor, according to embodiments of the disclosure.

FIG. 9 shows a graph illustrating a response curve of magnetic field sensors 100, 300 or 400, according to embodiments of the disclosure. As shown in FIG. 9, a response curve of resistance (R) versus magnetic field (H) (i.e., R vs. H) for MTJ element 102 is not linear. With reference to FIGS. 4 and 9, in accordance with embodiments of the disclosure, sensors 100, 300, 400 including MTJ elements 102 generate a unique signal (e.g., resistance change across the sensor) for every direction of external magnetic field 116 (FIG. 4) applied thereto. The response curves (R vs. H) exhibit less noise and variability, compared to conventional magnetic field sensors.

As noted previously, one would normally obtain generally two response curve extremes: one with maximum resistance change where the external magnetic field was perpendicular to the free direction of the MTJ elements in the Wheatstone bridge, and no resistance change where the external magnetic field was parallel to the free direction of the MTJ elements in the Wheatstone bridge. Also, external magnetic fields, that were non-orthogonal to the sensing layers in the sensor, e.g., at 45°, would create ambiguous results (see, e.g., fields 116B or 116C in FIG. 10). For example, using current Wheatstone bridge approaches, there is no difference in measured resistance for a magnetic field at +45° from the direction of the magnetic field in the sensing layer, and a magnetic field that is at is −45° from the direction of the magnetic field in the sensing layer.

MTJ elements 102 of sensor 100, 300, 400 generate a unique resistance for every direction of external magnetic field 116 applied thereto. More particularly, sensor 100, 300, 400 can be formed to ensure a pair of MTJ elements 102 within each set 170, 172 are perpendicular to or close to perpendicular to external magnetic field 116 to elicit a maximized response from those MTJ elements 102. Those MTJ elements 102 that are not perpendicular to external magnetic field 116 and not parallel thereto also contribute to the resistance change, creating the unique signal.

Figure 10:
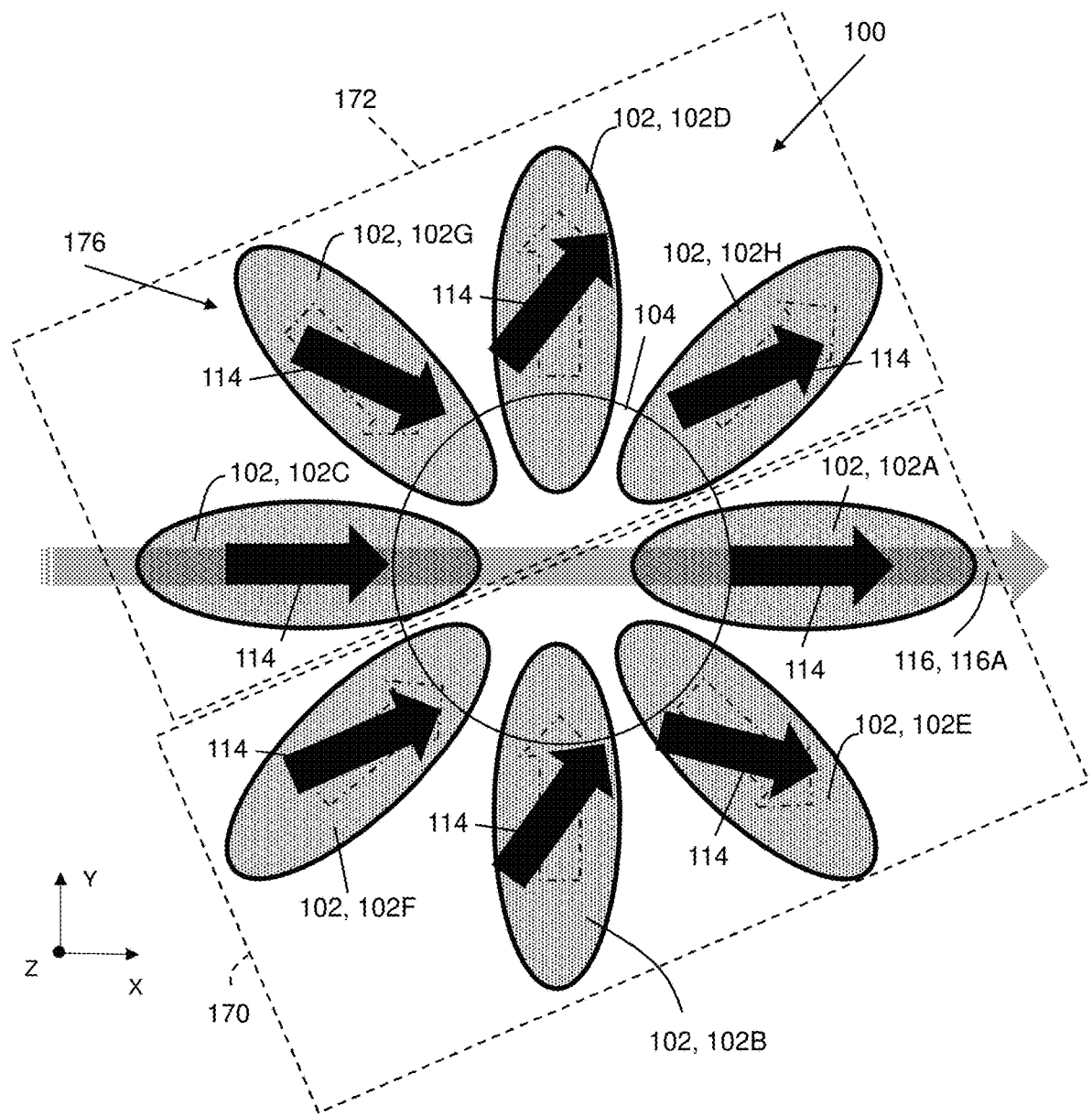
FIGS. 10-13 show schematic plan views of a magnetic field sensor having external magnetic fields of different directions applied thereto, according to further embodiments of the disclosure.
Figure 11:
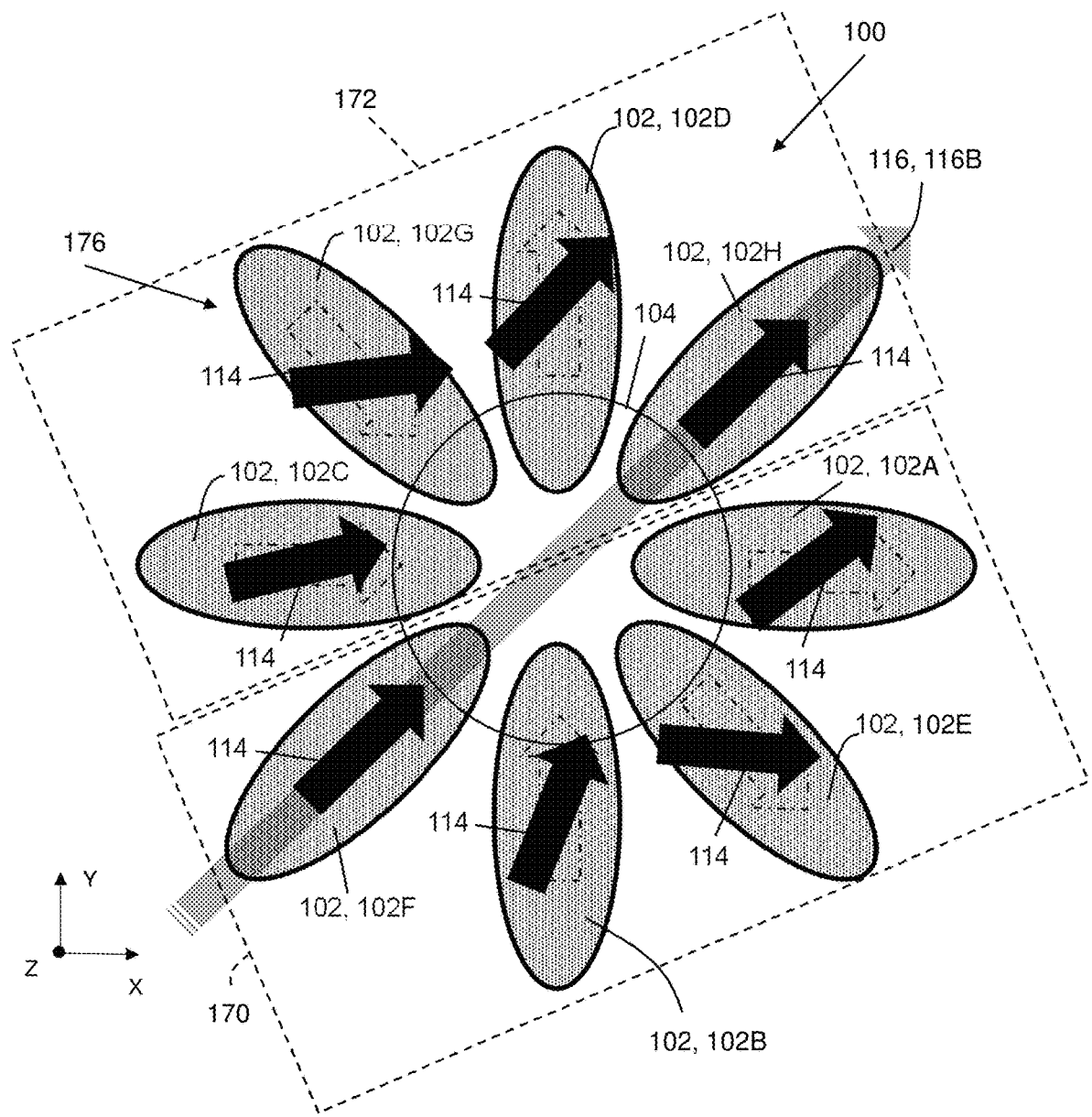

With reference to FIGS. 10-11, application of illustrative external magnetic fields 116 to sensor 100 of FIG. 4 will be described to explain the operation of sensors 100, 300, 400. In operation, a parameter to be measured, such as electrical current, creates an external magnetic field 116 that causes a rotation in magnetic field 112 (FIG. 2A) in sensing layer 110 (FIG. 2A) of MTJ elements 102 in a sensor, changing their states 114. The rotation in magnetic field 112 (FIG. 2A) in sensing layer 110 causes a change in the resistance (R) (FIG. 2A) (e.g., measured as voltage change) in the serially connected MTJ elements 102 that can be quantified to allow measurement of the parameter. The quantification of the parameter can occur using any now known or later developed technique, e.g., calibration. As the manner of quantifying the measurement is well known, no further detail is warranted.

FIG. 10 shows application of external magnetic field 116A (left-to-right on the page) and its impact on states 114 of MTJ elements 102 in sensor 100. (Note, the original states of MTJ elements 102A-H are shown in phantom behind the black arrows indicating the current states 114 as rotated by the external magnetic field 116A.) As illustrated, external magnetic field 116A causes a maximum response (i.e., maximum rotating in magnetic field 112 (FIG. 2A) and maximum change in resistance) in MTJ elements 102B, 102D because they are perpendicular to external magnetic field 116A. No change is registered in MTJ elements 102A and 102C because they are parallel to external magnetic field 116A. External magnetic field 116A also causes rotating in magnetic field 112 (FIG. 2A) in MTJ elements 102E, 102F, 102G and 102H, i.e., the MTJ elements 102 that are non-orthogonal and non-parallel to external magnetic field 116A. The change in resistance across sensor 100, 300 or 400 contributed by these MTJ elements creates a signal that is unique to external magnetic field 116A because of its direction. That is, the resistance change is unique to the direction of external magnetic field 116A, allowing measurement and identification of the direction of the field.

FIG. 11 shows application of external magnetic field 116B (e.g., at a 45° angle left-to-right on the page) and its effect on states 114 of MTJ elements 102 in sensor 100. As illustrated, external magnetic field 116B causes a maximum response (i.e., maximum rotating in magnetic field 112 (FIG. 2A) and maximum change in resistance) in MTJ elements 102E, 102G because they are perpendicular to external magnetic field 116B. No change is registered in MTJ elements 102F and 102H because they are parallel to external magnetic field 116B. External magnetic field 116B also causes rotating in magnetic field 112 (FIG. 2A) in MTJ elements 102A, 102B, 102C and 102D, i.e., the MTJ elements 102 that are non-orthogonal and non-parallel to external magnetic field 116B. The change in resistance across sensor 100, 300 or 400 contributed by these MTJ elements creates a signal that is unique to external magnetic field 116B because of its direction. Other external magnetic fields, e.g., 116C in FIG. 4, create unique signals in a similar manner.

Figure 12:
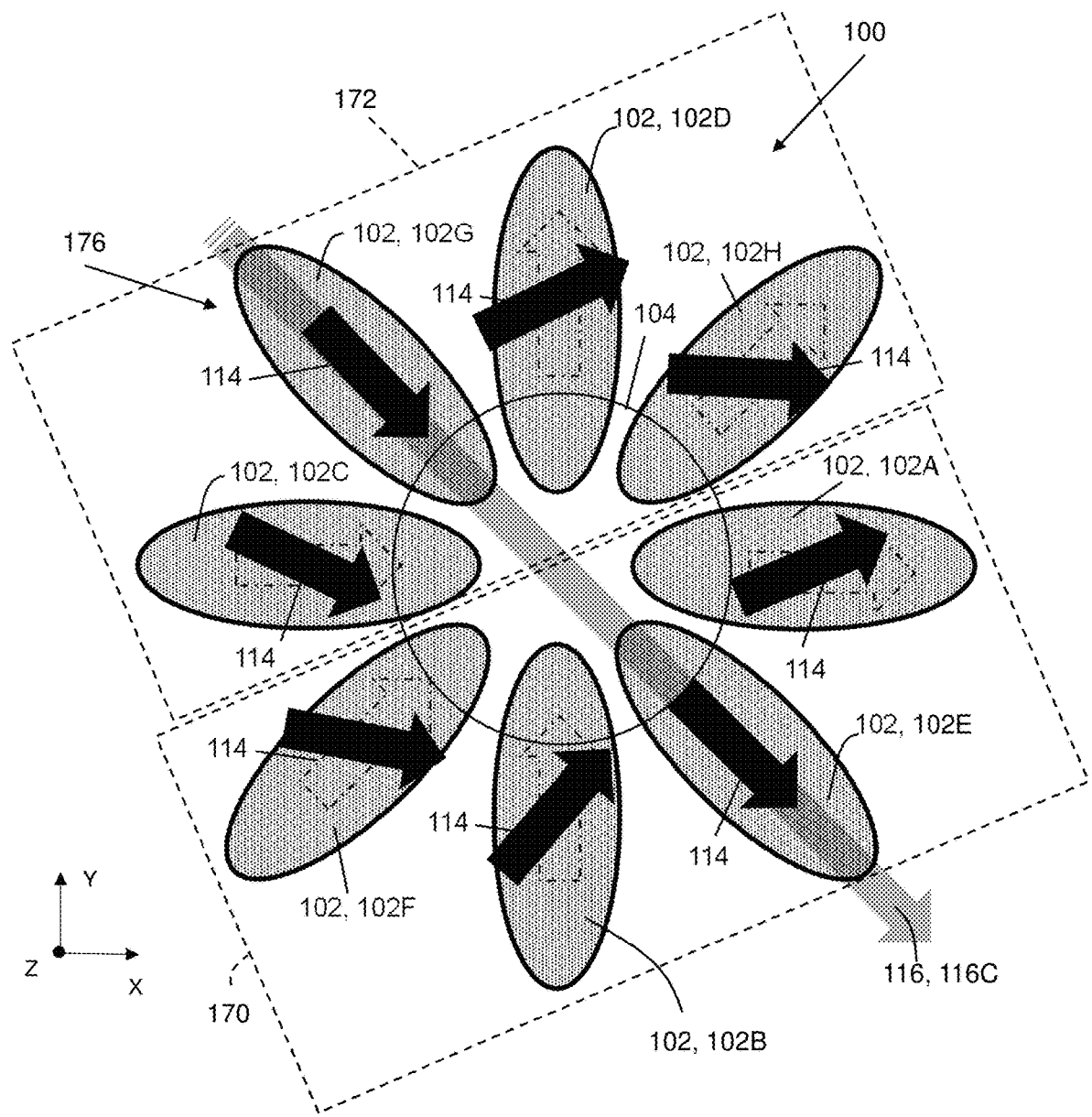
Figure 13:
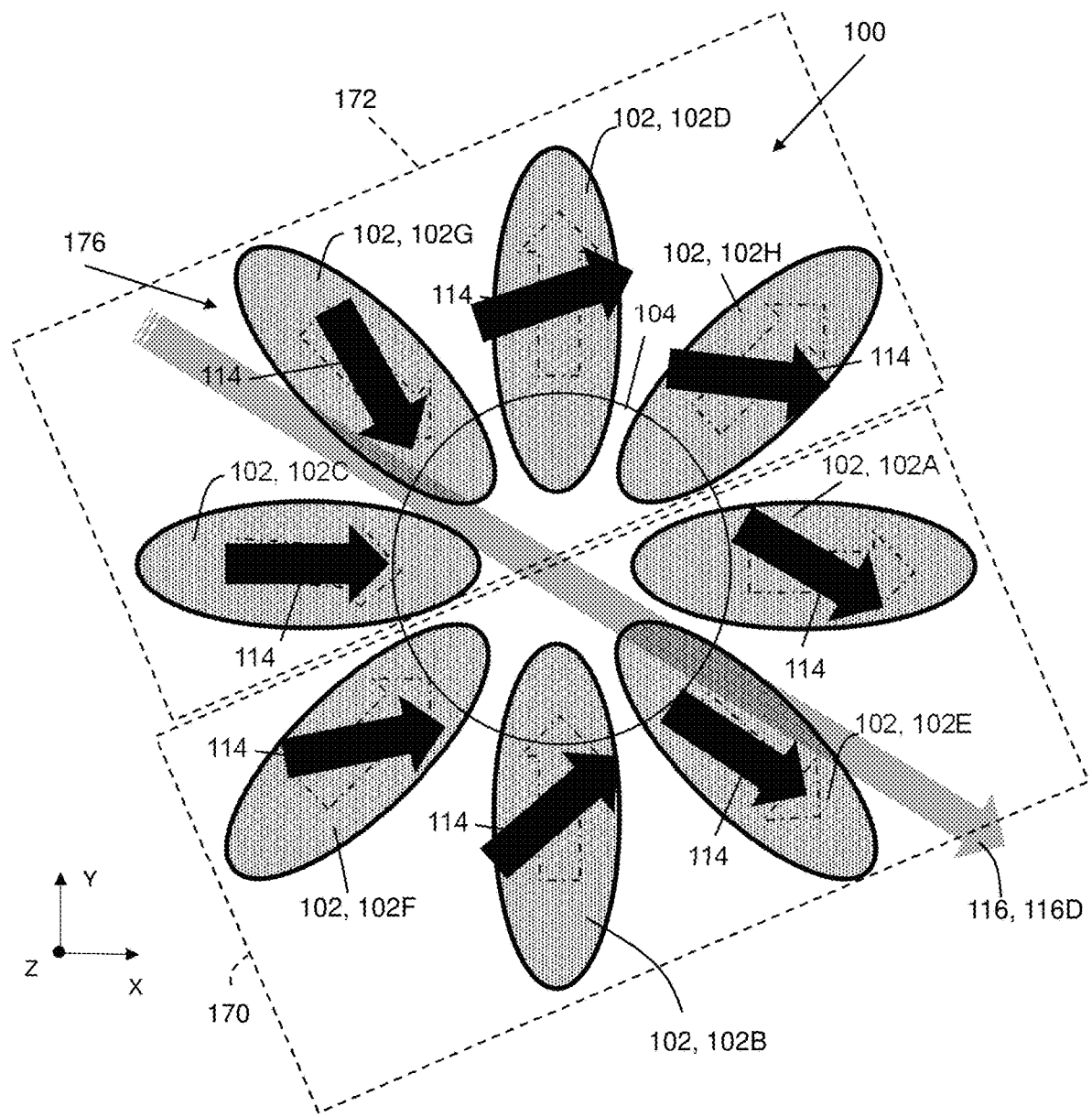

For purposes of description only, assume resistance contribution of each MTJ element 102 ranges from 0 to 10 units. For external magnetic field 116A in FIG. 10, MTJ elements 102B, 102D contribute a maximum 10 units each, while MTJ elements 102E, 102H may contribute +5 units each, and MTJ elements 102F, 102G may contribute −5 units each. MTJ elements 102A and 102C do not contribute because external magnetic field 116A is parallel to their magnetic moment. External magnetic field 116A generates 20 units, which is a unique signal corresponding to the direction of external magnetic field 116A. For external magnetic field 116B in FIG. 11, MTJ elements 102E, 102G contribute a maximum 10 units each, while MTJ elements 102A, 102D may contribute +2.2 units each, and MTJ elements 102B, 102C may contribute −0.8 units each. MTJ elements 102B and 102F do not contribute because external magnetic field 116B is parallel to their magnetic moment. External magnetic field 116B thus generates a unique signal of 22.4 units. For external magnetic field 116C in FIG. 12, MTJ elements 102F, 102H contribute a maximum 10 units each, while MTJ elements 102A, 102B may contribute +3 units each, and MTJ elements 102C, 102H may contribute −1.5 units each. MTJ elements 102E and 102G do not contribute because external magnetic field 116C is parallel to their magnetic moment. External magnetic field 116C generates 23 units, which is a unique signal corresponding to the direction of external magnetic field 116C. For external magnetic field 116D in FIG. 13, due to the direction of the field, all MTJ elements 102 contribute. For example, MTJ elements 102F, 102H contribute a close to maximum 9.4 units each, while the followings MTJ elements the following units: 102A +5, 102B +4.9, 102C −2.5, 102D −2.2, 102E +1.2, 102G −1.1. External magnetic field 116D generates 24.1 units, which is a unique signal corresponding to the direction of external magnetic field 116D. Differently directed external magnetic fields 116 generate similar unique and identifying signals.

While embodiments of the disclosure have been described herein with four or eight MTJ elements 102 in a sensor 100, it is emphasized that any number of MTJ elements 102 may be employed, e.g., 10, 16, 18, etc.

As noted herein, plurality of MTJ elements 102 function collectively in a floral pattern 176 (FIGS. 1 and 4), i.e., as if centered about a center point CP and extending radially therefrom. In this regard, it will be recognized that MTJ elements 102 may be physically laid out in any fashion using thin film technology. For example, as shown in the example in FIG. 14, MTJ elements 102 may be built in rows, columns or arrays of MTJ elements 102 having the same state 114, but be electrically serially connected by line 104 to collectively act as if in floral pattern 176.

Embodiments of the disclosure provide a magnetic field sensor 100, 300, 400 for measuring a variety of parameters that create an external magnetic field, e.g., current, position, direction, motion, etc. The sensor can have the states of its MTJ elements arranged in any desired manner to measure the external magnetic field regardless of the direction of the external magnetic field. Advantageously, each direction of an external magnetic field applied to the sensor creates a unique signal, e.g., resistance change as measured by voltage, in the sensor, removing any ambiguity as to the direction of the external magnetic field. As described, the magnetic field sensor can be arranged as a two-dimensional sensor or a three-dimensional sensor. The magnetic field sensor also has a unique response curve (R vs. H) that exhibits less noise and variability. The sensor can be built using thin film technology using MTJ elements that are all identical, thus eliminating the manufacturing challenges of forming two types of MTJ. The sensor also employs a significantly lower number of MTJ elements, e.g., as few as four compared to hundreds.

The resulting integrated circuit chips including sensor 100, 300, 400 as described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" are not to be limited to the precise value specified. "Approximately" has been expressly defined herein as it applies to the states of MTJ elements 102. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A magnetic field sensor, comprising:
   a first plurality of magnetic tunnel junction (MTJ) elements, each MTJ element of the first plurality of MTJ elements having a state indicated by a magnetic moment direction of a sensing layer relative to a pinned, reference layer in an absence of an external magnetic field, the first plurality of MTJ elements arranged into two identical sets of at least two MTJ elements, each MTJ element in each respective set having a different state, the two identical sets and the at least two MTJ elements in each set being electrically serially connected,
   wherein the first plurality of MTJ elements are arranged in a floral pattern, the floral pattern including each MTJ element in the first plurality of MTJ elements extending radially from a common center point.

2. The magnetic field sensor of claim 1, wherein each set includes the at least two MTJ elements including:
   a first MTJ element having the state thereof in a first direction; and
   a second MTJ element having the state thereof in a second direction approximately perpendicular to the first direction.

3. The magnetic field sensor of claim 2, wherein each set further includes:
   a third MTJ element having the state thereof in a third direction of between 10° and 80° relative to the first direction; and
   a fourth MTJ element having the state thereof in a fourth direction of between 110° and 170° relative to the first direction.

4. The magnetic field sensor of claim 1, wherein each of the first plurality of MTJ elements include identical layers.

5. The magnetic field sensor of claim 1, wherein the first plurality of MTJ elements are positioned in a first quarter arm of a Wheatstone bridge, and wherein the Wheatstone bridge includes a second quarter arm, a third quarter arm and a fourth quarter arm that each include a resistor of a fixed value.

6. The magnetic field sensor of claim 1, wherein the first plurality of MTJ elements are positioned in a first quarter arm of a Wheatstone bridge, and wherein the Wheatstone bridge further includes a second quarter arm including a second plurality of MTJ elements, a third quarter arm including a third plurality of MTJ elements, and a fourth quarter arm including a fourth plurality of MTJ elements,
   wherein the MTJ elements in each of the first plurality of MTJ elements, the second plurality of MTJ elements, the third plurality of MTJ elements and the fourth plurality of MTJ elements are electrically connected in series, and
   wherein the first plurality of MTJ elements and the third plurality of MTJ elements are in opposing quarter arms of the Wheatstone bridge and have identical arrangements, and the second plurality of MTJ elements and the fourth plurality of MTJ elements are in opposing quarter arms the Wheatstone bridge and have identical arrangements, wherein the second plurality of MTJ elements and the fourth plurality of MTJ elements have different arrangements than the first plurality of MTJ elements and the third plurality of MTJ elements.

7. The magnetic field sensor of claim 1, wherein the first plurality of MTJ elements generate a unique signal for every direction of an external magnetic field applied thereto.

8. The magnetic field sensor of claim 1, wherein the first plurality of MTJ elements are arranged in two dimensions, and further comprising a magnetic field diverter positioned to direct an external magnetic field having a direction outside of the two dimensions into the two dimensions for sensing by the first plurality of MTJ elements.

9. The magnetic field sensor of claim 8, wherein the magnetic field diverter has a frusto-conical shape.

10. A magnetic field sensor, comprising: a first plurality of magnetic tunnel junction (MTJ) elements, each MTJ element of the first plurality of MTJ elements having a state indicated by a magnetic moment direction of a sensing layer relative to a pinned, reference layer in an absence of an external magnetic field, the first plurality of MTJ elements arranged into two identical sets of at least two MTJ elements, each MTJ element in each respective set having a different state, the two identical sets and the at least two MTJ elements in each set being electrically serially connected, wherein the first plurality of MTJ elements includes at least:
- a first MTJ element having the state thereof in a first direction, and
- a second MTJ element having the state thereof in a second direction approximately perpendicular to the first direction,
- wherein the first plurality of MTJ elements generate a unique signal for every direction of an external magnetic field applied thereto, and
- wherein the first plurality of MTJ elements are arranged in a floral pattern, the floral pattern including each MTJ element in the first plurality of MTJ elements extending radially from a common center point.

11. The magnetic field sensor of claim 10, wherein each set further includes:
- a third MTJ element having the state thereof in a third direction of between 10° and 80° relative to the first direction; and
- a fourth MTJ element having the state thereof in a fourth direction of between 110° and 170° relative to the first direction.

12. The magnetic field sensor of claim 10, wherein the first plurality of MTJ elements include identical layers.

13. The magnetic field sensor of claim 10, wherein the first plurality of MTJ elements are positioned in a first quarter arm of a Wheatstone bridge, and wherein the Wheatstone bridge includes a second quarter arm, a third quarter arm and a fourth quarter arm that each include a resistor of a fixed value.

14. The magnetic field sensor of claim 10, wherein the first plurality of MTJ elements are positioned in a first quarter arm of a Wheatstone bridge, and wherein the Wheatstone bridge further includes a second quarter arm including a second plurality of MTJ elements, a third quarter arm including a third plurality of MTJ elements, and a fourth quarter arm including a fourth plurality of MTJ elements,
- wherein the MTJ elements in each of the first plurality of MTJ elements, the second plurality of MTJ elements, the third plurality of MTJ elements and the fourth plurality of MTJ elements are electrically connected in series, and
- wherein the first plurality of MTJ elements and the third plurality of MTJ elements are in opposing quarter arms of the Wheatstone bridge and have identical arrangements, and the second plurality of MTJ elements and the fourth plurality of MTJ elements are in opposing quarter arms of the Wheatstone bridge and have identical arrangements, wherein the second plurality of MTJ elements and the fourth plurality of MTJ elements have different arrangements than the first plurality of MTJ elements and the third plurality of MTJ elements.

15. The magnetic field sensor of claim 10, wherein the first plurality of MTJ elements are arranged in two dimensions, and further comprising a magnetic field diverter positioned to direct an external magnetic field having a direction outside of the two dimensions into the two dimensions for sensing by the first plurality of MTJ elements.

16. A magnetic field sensor, comprising:
- a plurality of magnetic tunnel junction (MTJ) elements arranged in two dimensions, each MTJ element of the plurality of MTJ elements having a state indicated by a magnetic moment direction of a sensing layer relative to a pinned, reference layer in an absence of an external magnetic field, the plurality of MTJ elements arranged into two substantially identical sets of at least two MTJ elements, each MTJ element in each respective set having a different state, the two substantially identical sets and the at least two MTJ elements in each set being electrically serially connected,
- wherein the plurality of MTJ elements are arranged in a floral pattern, the floral pattern including each MTJ element in the plurality of MTJ elements extending radially from a common center point; and
- a magnetic field diverter positioned to direct an external magnetic field having a direction outside of the two dimensions into the two dimensions for sensing by the plurality of MTJ elements.

17. The magnetic field sensor of claim 16, wherein the plurality of MTJ elements generate a unique signal for every direction of an external magnetic field applied thereto.

18. The magnetic field sensor of claim 16, wherein the plurality of MTJ elements include the same material layers.

\* \* \* \* \*